United States Patent [19]

Bourez et al.

[11] Patent Number: 5,693,199
[45] Date of Patent: Dec. 2, 1997

[54] SINGLE CHAMBER SPUTTERING ASSEMBLY

[75] Inventors: Allen J. Bourez; Brij Bihari Lal, both of San Jose; Michael A. Russak, Los Gatos, all of Calif.

[73] Assignee: HMT Technology Corporation, Fremont, Calif.

[21] Appl. No.: 685,694

[22] Filed: Jul. 24, 1996

Related U.S. Application Data

[63] Continuation-in-part of Ser. No. 401,449, Mar. 9, 1995, Pat. No. 5,512,150, and Ser. No. 628,779, Apr. 5, 1996.

[51] Int. Cl.$^6$ .................................. C23C 14/34; C23C 14/35
[52] U.S. Cl. .................................. 204/192.12; 204/298.09; 204/298.26
[58] Field of Search .................... 204/192.12, 298.09, 204/298.26

[56] References Cited

U.S. PATENT DOCUMENTS

| | | | |
|---|---|---|---|
| 4,046,660 | 9/1977 | Fraser | 204/192.12 |
| 4,226,681 | 10/1980 | Shirahata et al. | 205/192 |
| 4,517,070 | 5/1985 | Kisner | 204/298.09 |
| 4,880,514 | 11/1989 | Scott et al. | 204/192.2 |
| 5,554,224 | 9/1996 | Foltyn | 118/725 |

FOREIGN PATENT DOCUMENTS

| | | | |
|---|---|---|---|
| 63-143256 | 6/1988 | Japan | 204/298.09 |
| 3-215663 | 9/1991 | Japan | 204/298.09 |
| 5-51734 | 3/1993 | Japan | 204/298.09 |

OTHER PUBLICATIONS

Cord, B., et al., "Sputtering of High Coercivity/Low Noise CoCrTa Bilayered Hard Disks in a Manufacturing System," *IEEE Trans. Magn.* 29(6): 3694–3696 (1993).

Judy, J.H., "Experimental Studies of Noise in Isotropic Longitudinal CoCrTa/Cr Thin Film Media," *IEEE Trans. Magn.* 29(1):209–214 (1993).

Shen, Y., et al., "Effects of Substrate Temperature on Magnetic Properties of CoCrTa/Cr Films," *IEEE Trans. Magn.* 28:326–328 (1992).

Teng, E., and Eltoukhy, A., "Flash Chromium Interlayer for High Performance Disks with Superior Noise and Coercivity Squareness," *IEEE Trans. Magn.* 29(6):3679–3681 (1993).

*Primary Examiner*—Aaron Weisstuch
*Attorney, Agent, or Firm*—Judy M. Mohr; Peter J. Dehlinger

[57] ABSTRACT

A sputtering assembly for use in forming sputter deposited layers on a substrate is described. The assembly includes a pair of confronting sputtering targets for depositing sputtered layers onto the substrate and a movably mounted heating means for heating the substrate. A method of using the assembly is also disclosed.

6 Claims, 9 Drawing Sheets

SINGLE CHAMBER SPUTTERING ASSEMBLY

This application is a continuation-in-part of application Ser. No. 08/401,449, now U.S. Pat. No. 5,512,150 "Target Assembly Having Inner and Outer Targets", filed Mar. 9, 1995, and of co-pending U.S. application Ser. No. 08/628,779, filed Apr. 5, 1996.

FIELD OF THE INVENTION

The present invention relates to a sputtering assembly for use in forming sputter deposited layers on a substrate. The assembly includes a pair of confronting sputtering targets for depositing sputtered layers onto the substrate and a movably mounted heater for heating the substrate.

REFERENCES

Cord, B., et al., *IEEE Trans. Magn.*, 29, 3694 (1993).
Hata, H., et al., *J. Appl. Phys.*, 67(9), 4692 (1990a).
Hata, H., et al., *IEEE Trans. Magn.*, 26(5), 2709 (1990b).
Judy, J., *IEEE Trans. Magn.*, 29(1), 209 (1993).
Katayama, S., et al., *IEEE Trans. Magn.*, 24(6), 2982 (1988).
Shen, Y. et al., *IEEE Trans. Magn.*, 28, 326 (1992).
Teng, E. et al., *IEEE Trans. Magn.*, 29(6), 3679 (1993).

BACKGROUND OF THE INVENTION

Longitudinal and perpendicular magnetic recording media, of the type formed on a rigid disc substrate, often include several layers formed from different materials, such as a chromium underlayer, a cobalt-based magnetic recording layer and a protective carbon overcoat. In some media, rather than a monolayer magnetic recording film, a bi-layer or multi-layer magnetic recording structure is formed which typically includes a plurality of thin magnetic films separated by a non-magnetic isolation layer, such as a chromium isolation layer (Katayama, Hata(a), Hata(b), Teng).

Such magnetic recording media are typically formed in a sputtering apparatus having a series of chambers for heating and sputtering. In such a sputtering process, a substrate is placed in a heating chamber, where the substrate is heated to the desired sputtering temperature by means of a heater, such as an infrared heater. The heated substrate is then shuttled to a first sputtering chamber, and a film or layer is deposited onto the substrate. The coated substrate is then shuttled to the next sputtering chamber, downstream from the first chamber, where another layer is deposited. The coated substrate is moved progressively from one chamber to the next for sputter deposition of each layer in the medium.

This process of fabricating media requires a plurality of chambers, one for each heating step and one for each layer deposited. Depending on the number of layers in the medium and the composition of each layer, the number of chambers required may exceed the number in a typical sputtering apparatus.

Another drawback to this method of sputtering is the large inventory of materials, such as sputtering targets, needed. This is especially the case where a medium having two layers formed of the same material is formed by sputtering that material in separate chambers; each chamber requiring a sputtering target.

Another disadvantage to sputtering multiple layers in separate sputtering chambers is the dwell time of the substrate, that is the time between completing heating or sputtering in one chamber and beginning sputtering in the next chamber. The substrate cools during this time, and the first layers are deposited at higher substrate temperatures than later layers in the medium. The different deposition temperatures affects the magnetic recording properties of the medium, especially for magnetic layers. Media having magnetic layers sputtered at higher temperatures have a higher coercivity and lower noise than media having magnetic layers deposited at lower temperatures (Cord, Shen, Judy).

Accordingly, it is an object of the invention to provide a sputtering assembly that provides a means of heating the substrate and depositing multiple thin-film layers in a single sputtering chamber, thereby reducing the required material inventory and the size of sputtering apparatus and minimizing the drop in substrate temperature.

SUMMARY OF THE INVENTION

In one aspect, the invention includes a sputtering assembly for use in sequentially heating and sputtering a substrate. The assembly includes a pair of confronting targets defining a sputtering region therebetween, a substrate held in the sputtering region between the targets for deposition when the targets are activated, and a heater having a pair of opposed heating faces. The heater is moveable between a heating position, where the heater faces are disposed in the sputtering region on opposite sides of the substrate for radiantly heating opposed sides of the substrate, and a sputtering position where the heater faces are outside of the sputtering region.

In one embodiment, the confronting targets of the assembly include inner and outer concentric targets for sputter deposition of two different materials on the substrate.

The assembly, in another embodiment, includes inner magnetic means disposed adjacent an inner annular portion of the inner targets, and having a substantially axial magnetic pole orientation, outer magnetic means disposed adjacent the outer targets and an outer annular region of each of the inner targets, and having a substantially radial magnetic pole orientation. At least one of the magnetic means is reversible in magnetic-pole polarity, wherein one polarity produces a magnetic flux sufficient to ignite a sputtering plasma in the inner targets only, when power is supplied to the inner targets at a preselected level, and the opposite polarity produces a magnetic flux sufficient to ignite a sputtering plasma in the outer targets only, when power is supplied to the outer targets at a preselected level.

The heater of the assembly, in a preferred embodiment, is an infrared lamp.

In another aspect, the invention includes a method of depositing by sputter deposition a layer on a substrate. The method includes placing the substrate in a sputtering chamber including (i) a pair of confronting targets defining a sputtering region there between and (ii) a heater having a pair of opposed heating faces. The heater is moveable between a heating position and a sputtering position, as described above. The heater is positioned in its heating position for heating the substrate to a selected sputtering temperature and is then moved to its sputtering position. The targets are energized to achieve ignition of a sputtering plasma in the sputtering region.

In one embodiment of this aspect, the substrate is placed between a pair of confronting targets composed of inner and outer concentric targets, each target having inner and outer magnetic means disposed adjacent said inner and outer targets, respectively, where at least one of said magnetic means is reversible in magnetic-pole polarity, and one polarity produces a magnetic flux sufficient to ignite a sputtering plasma in the inner target only, and the opposite polarity produces a magnetic flux sufficient to ignite a sputtering plasma in the outer target only. The polarity of one of the magnetic means is oriented to achieve ignition of a sputtering plasma in the inner target, when power is supplied to the inner target at a preselected level.

A layer is sputtered from the inner target onto the substrate. The polarity of the magnetic means is then reversed to achieve ignition of a sputtering plasma in the outer target, when power is supplied to the outer target at a preselected level. A layer is sputtered from the outer target directly on the layer sputtered from said inner target.

These and other objects and features of the invention will be more fully appreciated when the following detailed description of the invention is read in conjunction with the accompanying drawings.

DETAILED DESCRIPTION OF THE INVENTION

The invention includes a sputtering assembly for use in forming sputter-deposited layers on a substrate, as in, for example, a magnetic recording medium of the type formed on a rigid disc-like substrate. The sputtering assembly includes a pair of confronting targets defining a sputtering region therebetween, a substrate held in the sputtering region for material deposition, and a heater, movably mounted between a heating position and a sputtering position, as will be described. The sputtering assembly, placed in a sputtering chamber of a conventional sputtering apparatus, is used to sequentially heat and sputter a substrate.

I. Sputtering Assembly

Figure 1:
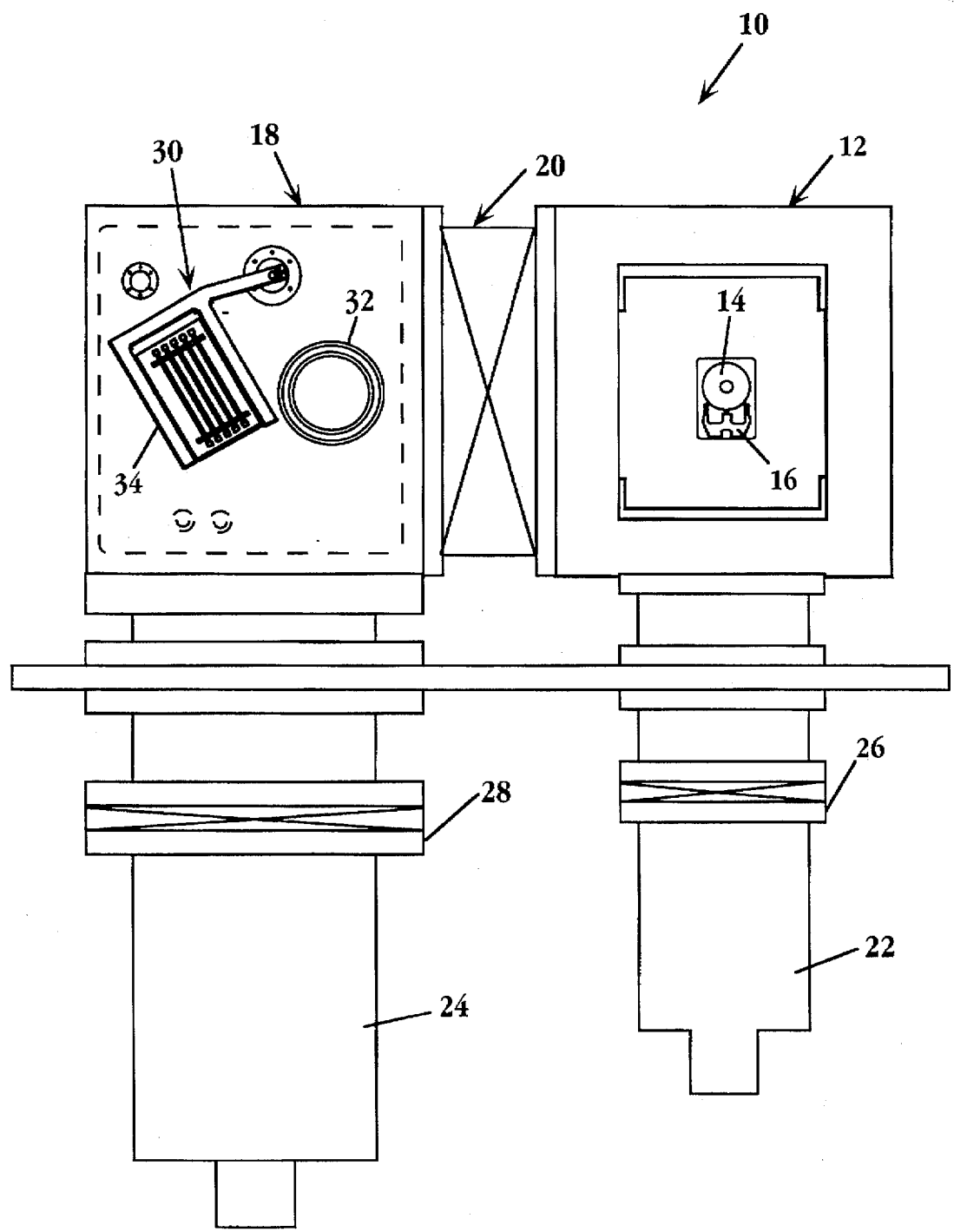
FIG. 1 is a plan view of a single chamber sputtering system including the sputtering assembly of the present invention.

FIG. 1 illustrates a single chamber sputtering system 10 which includes the sputtering assembly of the present invention. The sputtering system shown FIG. 1 includes an input/output load lock 12, where a single disc 14 is loaded into the apparatus for sputtering. Disc 14 is placed on a conventional v-block pedestal 16 for transport into the sputtering chamber 18 which includes the sputtering apparatus of the present invention. The load lock and the sputtering chamber are separated by a valve 20. Vacuum pumps 22, 24 are connected to load lock 12 and sputtering chamber 18 through valves 26, 28, respectively.

Sputtering chamber 18 includes a sputtering apparatus 30 composed of a target assembly 32, to be described in detail below, and a heater 34. Heater 34 is movably mounted for positioning between a sputtering position and a heating position, as will be described.

Figure 2:
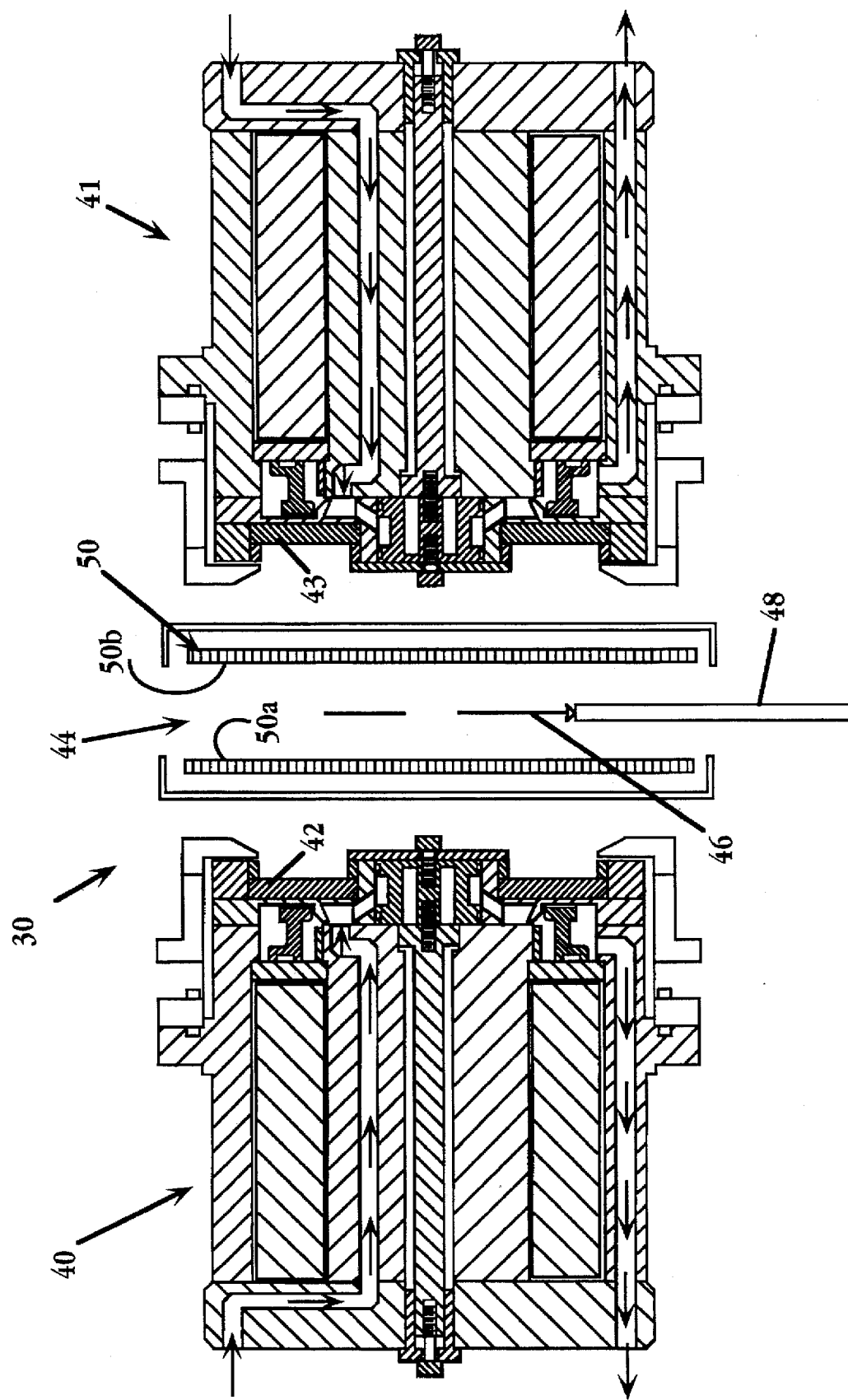
FIG. 2 is a cross sectional view of the sputtering assembly of the present invention.

FIG. 2 is a cross sectional view of sputtering assembly 30 shown in FIG. 1. The assembly includes a pair of confronting target assemblies 40, 41 each having a sputtering target, such as targets 42, 43 which define a sputtering region 44 for receiving a substrate 46, carried on pedestal 48. Confronting targets 42, 43 are activated by applying a DC voltage or RF signal to the target for deposition of target material onto the substrate placed in the sputtering region.

Sputtering apparatus 30 also includes a heater 50 having a pair of opposed heating faces, 50a, 50b. Heater 50 is shown in the figure in a heating position, where the heater faces are disposed on opposite sides of substrate 46 for radiantly heating opposed sides of the substrate. As will be described below, the heater is moved to a sputtering position when the confronting targets are energized for material deposition, and may be moved back to its heating position for sequential heating and sputtering.

Figure 3A:
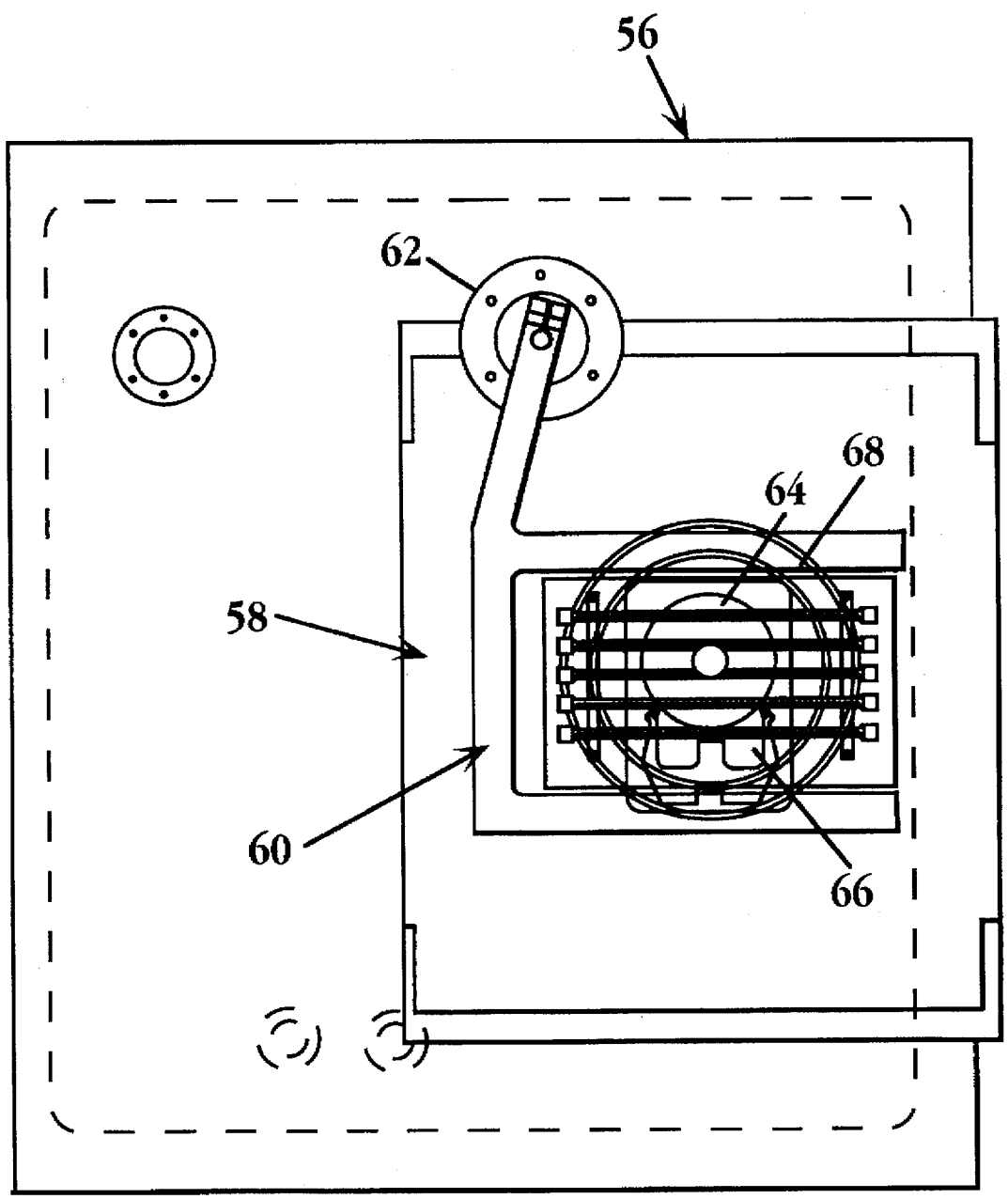
FIGS. 3A–3B are plan views of the sputtering assembly, where the heating means is in its heating position and (FIG. 3A) and in its sputtering position (FIG. 3B)
Figure 3B:
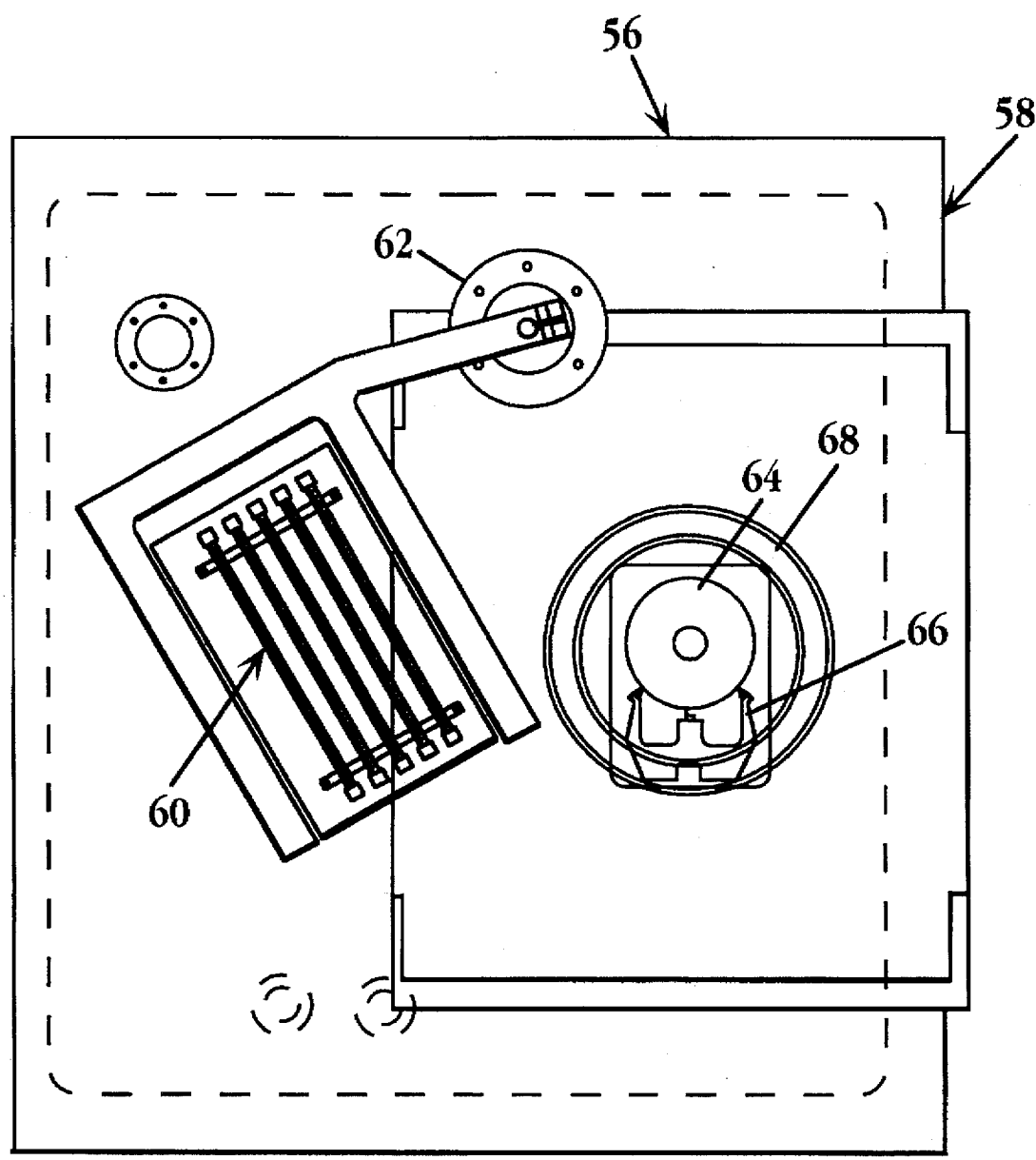

FIG. 3A shows in plan view a sputtering assembly in accordance with the invention, with the heater in its heating position. Seen here is a sputtering chamber 56 in which sputtering assembly 58 is mounted. A heater 60 is movably mounted by hinge 62 for positioning between a heating position and a sputtering position, as shown in FIG. 3B. In the heating position, opposed faces of the heater are disposed between a substrate, such as substrate 64 carried on pedestal 66, and a target assembly 68.

Figure 4:
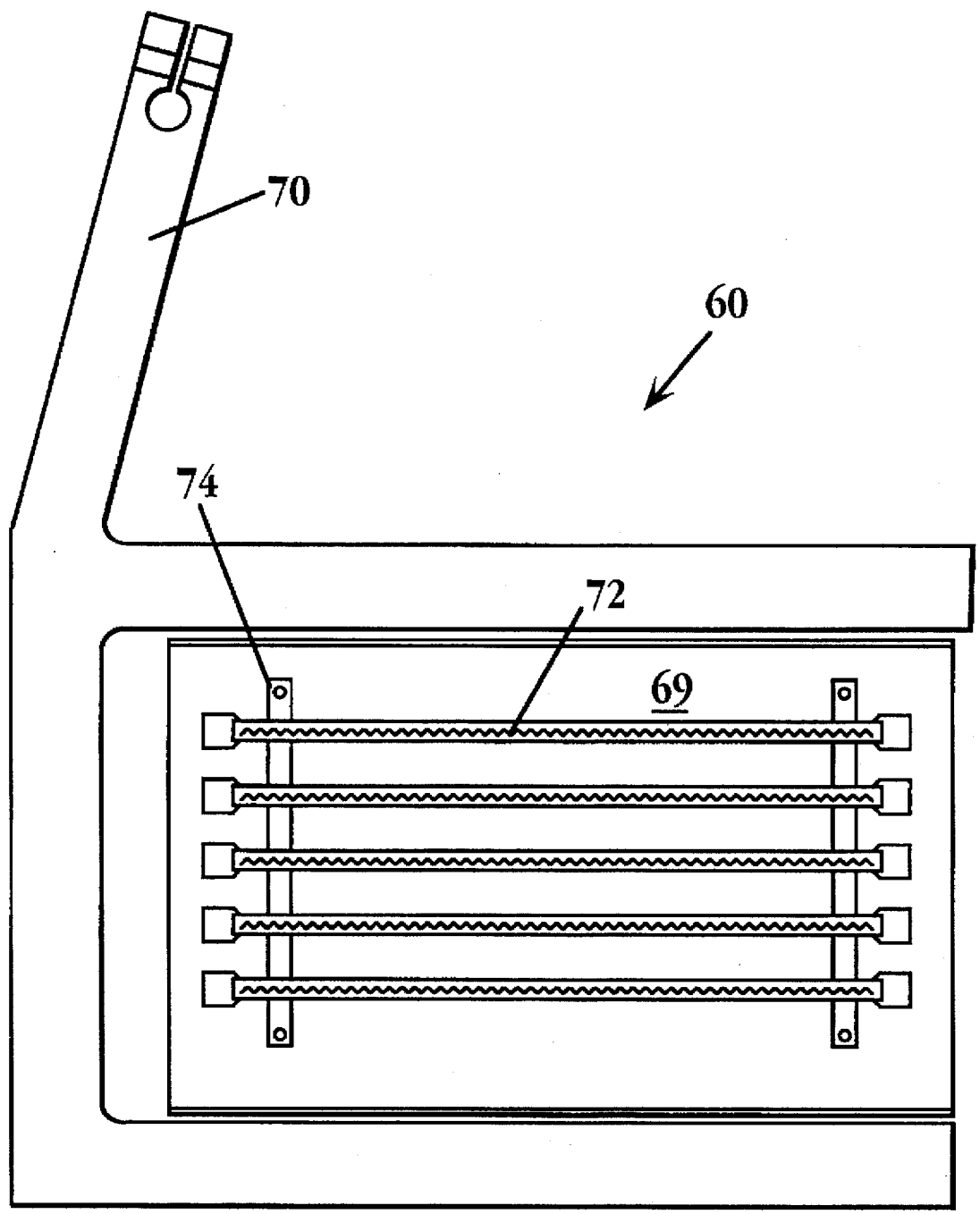
FIG. 4 is a plan view of an infrared heating means for use in the sputtering assembly.

Heater 60, in a preferred embodiment, is an infrared heating lamp, as shown in FIG. 4. The heater has a pair of opposed heating faces, such as face 69. Arm 70 connects the heater to a mounting fixture (not shown) movably mounting the lamp to the sputtering chamber. Infrared lamps, such as lamp 72, are secured to the face of the heater by means of a lamp mount 74. Other heaters suitable for use in the present invention include resistive heaters and RF plasma heating.

FIG. 3B shows the sputtering assembly where heater 60 is in its sputtering position. That is, heater 60 is in a position such that the heater faces are outside of the sputtering region defined by the confronting targets. When the heater is in its sputtering position, the sputtering targets of the target assembly are activated for material deposition, as will be described below.

A. The Target Assembly

Figure 5:
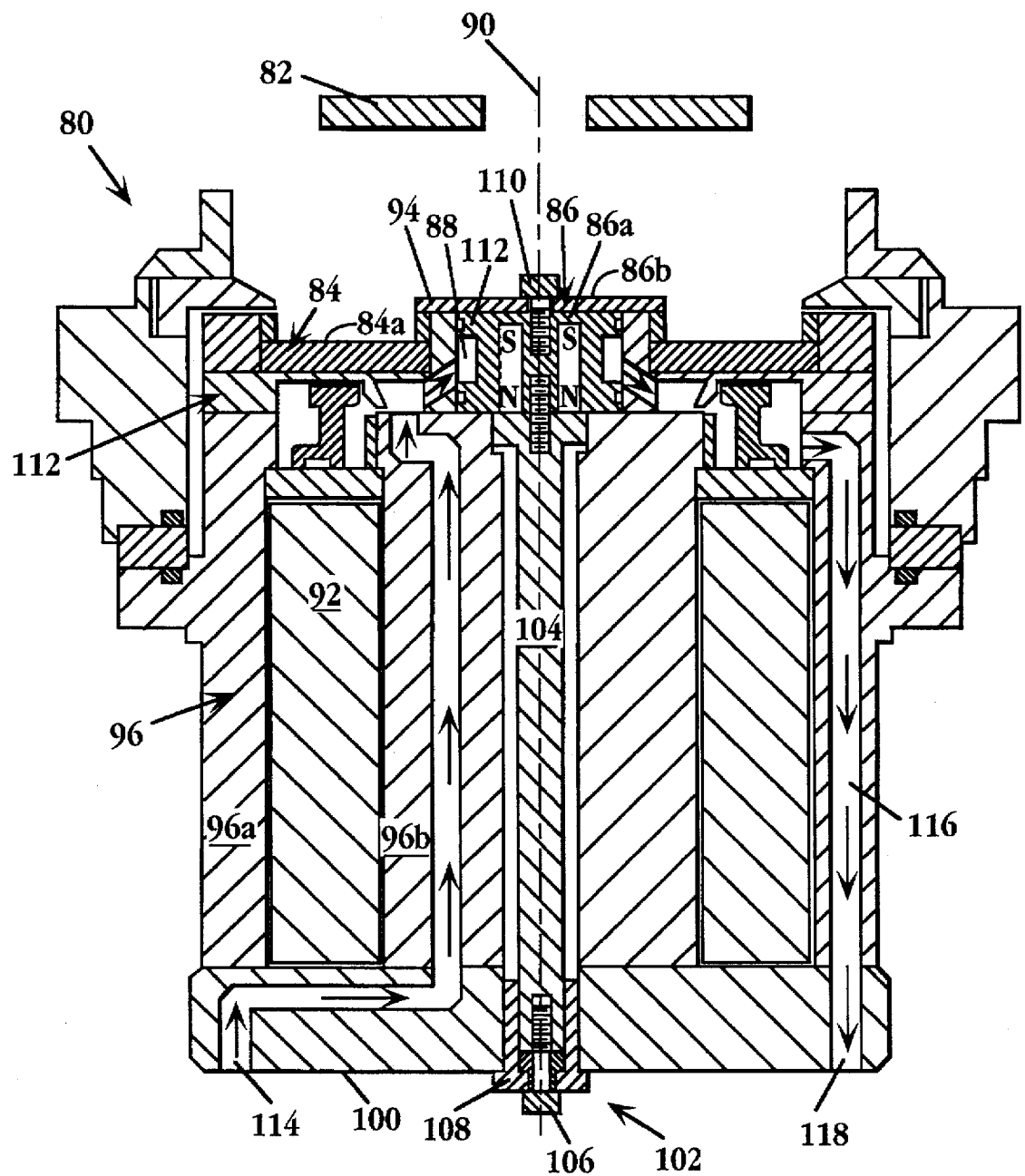
FIG. 5 is a cross section of a target assembly included in the sputtering apparatus in one embodiment of the present invention.

FIG. 5 shows in cross sectional view an annular target assembly 80 positioned in a sputtering chamber (not shown) for use in the sputtering apparatus of the present invention, and in particular for use in forming a thin-film recording medium, described below. It will be appreciated that a similar target assembly may be positioned "above" assembly 80 for sputtering a desired film onto the upper and lower sides of a substrate 82 positioned between the confronting target assemblies.

Target assembly 80 includes an annular outer target 84 which, in combination with an opposed target of a confronting target assembly, defines a sputtering region for receiving substrate 82. In a preferred embodiment of the invention, target assembly 80 also includes an inner annular target 86, concentric with outer target 84. Preferably, the inner and outer targets are composed of different materials for sputtering alternating layers of two different materials onto a substrate, as will be described. For example, the inner target, which typically has an outer diameter of about 2.25 inches, an inner diameter of about 0.19 inches, and is approximately 0.125 inches in thickness, may be composed of either a magnetic or a non-magnetic material, such as copper, MgO, titanium, NiFe, chromium, or a cobalt-based alloy.

The outer target is typically 5 inches in outer diameter, 2 inches in inner diameter, with a thickness of about 0.25 inches and is composed of either a magnetic or a non-magnetic material, such as carbon or a cobalt-based alloy.

Disposed adjacent an inner annular portion 86a of the inner target is a permanent magnet 88 having poles, such as a north pole and a south pole designated in FIG. 5, according to convention, as N and S, respectively. Permanent magnet 88 is positioned with its magnetic poles in a substantially axial orientation with respect to the central axis of the target assembly, represented by axis 90. As shown here, the magnet is positioned such that the south pole is nearer inner target 86 than is the north pole. A magnetic field is produced over the inner target surface 86b, as discussed below with respect to FIG. 6, that serves to confine the sputtering plasma to a defined region about the target surface for deposition of material onto substrate 82.

It will be appreciated that permanent magnet 88 may also be an electromagnet, or other suitable magnetic means. An inner magnetic means, as referred to herein, refers to such a permanent magnet, or an electromagnet, disposed adjacent the inner annular portion of the inner target.

An electromagnetic coil assembly 92, also referred to herein as outer magnetic means, is disposed adjacent outer target 84 and an outer annular portion 94 of inner target 86. Electromagnet 92 is oriented with its magnetic poles substantially radial to the central axis of the target assembly. When the coil assembly of electromagnet 92 is energized, a magnetic field is generated, as will be described with respect to FIG. 6, that serves to confine the sputtering plasma to a defined region about outer target surface 84a for deposition on substrate 82.

The outer magnetic means is housed in a pole weldment assembly 96, including an outer cylindrical pole piece 96a and an inner cylindrical pole piece 96b, having a smaller diameter than the outer pole piece. The inner and outer pole pieces are formed of a material, such as 410 stainless steel, that is suitable for conducting magnetic flux, as will be discussed below.

At least one of the magnetic means, that is, either the inner magnetic means or the outer magnetic means, is reversible in magnetic polarity. In a preferred embodiment, described in more detail in FIGS. 6 and 7, the inner magnetic means is a permanent magnet, having an axial magnetic pole orientation with the south pole closer to the inner target, as illustrated in FIG. 5. The outer magnetic means is an electromagnet where the polarity is reversible by changing the direction of the applied current, by means of a relay switch or the like, as will be described. One polarity produces a magnetic flux that is sufficient to ignite a sputtering plasma in the inner target only, when power is applied to the target at a preselected level. The opposite polarity produces a magnetic flux sufficient to ignite a sputtering plasma in the outer target only, when power is supplied to the target at a preselected level.

With continuing reference to FIG. 5, a rear pole 100 caps the pole weldment assembly and is held in place by an end assembly 102. End assembly 102 includes a central pole 104 secured at one end by a screw 106 and a pole cap 108.

At the opposite end of the central pole, a screw 110 secures the central pole and the inner target. Inner target 86 abuts a cooling, backing plate 112, made of a material with a high heat transfer coefficient, such as copper. As seen, screw 110, which is formed of stainless steel, fixes the inner target to the backing plate. The target may also be bonded to the backing plate with a suitable adhesive.

Outer target 84 abuts a circular backing plate 112, which forms part of the inner and outer pole pieces of the pole weldment assembly for conducting magnetic flux. The backing plate may also include an annular shunt, as described in U.S. Pat. Nos. 5,174,880 and 5,512,150, which are incorporated by reference herein.

The target assembly is cooled by water which enters through inlet channel 114, travels in channel 116 around a cavity about the inner and outer targets, and exits via an outlet channel 118.

The target assembly is mounted to a sputtering chamber in a sputtering apparatus through mounting flange 119 and includes appropriate insulators and shields.

The target assembly may also include a means for placing a negative voltage bias of between −50 and −500 volts on the substrate during sputter deposition. Also included in the assembly, but not shown in the figure, is a DC power source for supplying power to the inner and outer targets.

Figure 6:
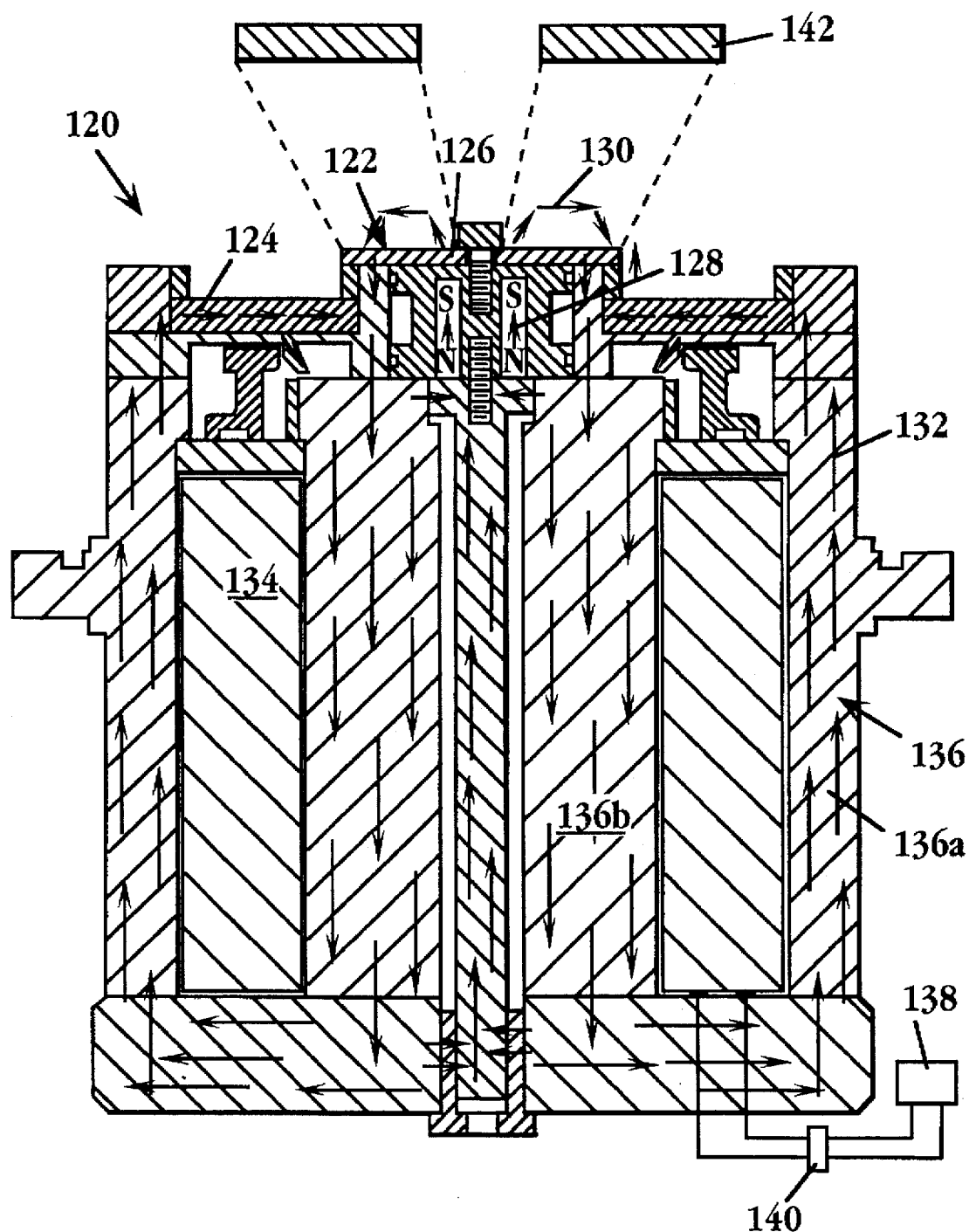
FIG. 6 shows the distribution of magnetic field lines in the target assembly shown in FIG. 5, with the magnetic means arranged for ignition of the inner target.

Turning now to FIG. 6, a target assembly 120, similar to that described in FIG. 5, is shown in cross section. Target assembly 120 includes an inner sputtering target 122 and an outer sputtering target 124, each having planar sputtering surfaces. Disposed adjacent an inner annular portion 126 of inner target 122 is a permanent magnet 128, having an axial pole orientation, with the south pole designated by an "S" in the figure and the north pole designated by an "N".

Permanent magnet 128 generates a magnetic field along a first path 130, where the magnetic field lines emerge from the permanent magnet at the inner annular portion of the inner target, bend over the surface of the inner target, and re-enter the target again, combining with a second magnetic flux path 132, to be described.

Disposed adjacent the outer target is an electromagnetic coil assembly 134 housed in a pole weldment assembly 136 having an outer pole piece 136a and an inner pole piece 136b.

Electromagnet 134 is controlled by a coil source control 138. A conventional relay switch 140 is positioned between the electromagnet and the coil source control. Relay 140 is a 24 V control signal for switching the electromagnet coil polarity, e.g., switching the current direction in the electromagnet coil.

At least one of the magnetic means is reversible in magnetic-pole polarity. Where the outer magnetic means is an electromagnet, the orientation of the magnetic poles is reversible by switching the direction of current applied to the electromagnetic coil of the electromagnet. The relay switch toggles between an on and an off position, and in this embodiment, when the relay switch is in the on position, and a low coil current is applied, the magnetic flux produced is sufficient to ignite only the inner target when power is applied to the inner target at a preselected level.

With continuing reference to FIG. 6, the magnetic field lines produced when the magnetic means are arranged for ignition of the inner target are illustrated. The inner magnetic means are oriented as shown in FIG. 6 and as described above to produce flux path 130. Coil source control 138 is adjusted to a low coil current of between about 0.1 and 1.0 amp, more preferably between 0.1 and 0.5 amp, and relay switch 140 is in the on position. Magnetic field 132 is created, which is represented by the arrows, and defined by magnetic flux in a first direction in the outer pole piece, across the outer target, and in an opposite direction along the inner pole piece.

This arrangement of magnetic means, which is effective to create the above described flux paths 130, 132, is referred to herein as reverse polarity.

In reverse polarity, the magnetic flux produced is sufficient to ignite a sputtering plasma only in the inner target, when power is supplied at a preselected level from a power source to the inner target. The magnetic flux produced by the electromagnet at a coil current of 0.1 and 1.0 amp is not usually sufficient to ignite a sputtering plasma in the outer target. In this way, material from the inner target can be deposited onto a substrate, such as substrate 142.

Figure 7:
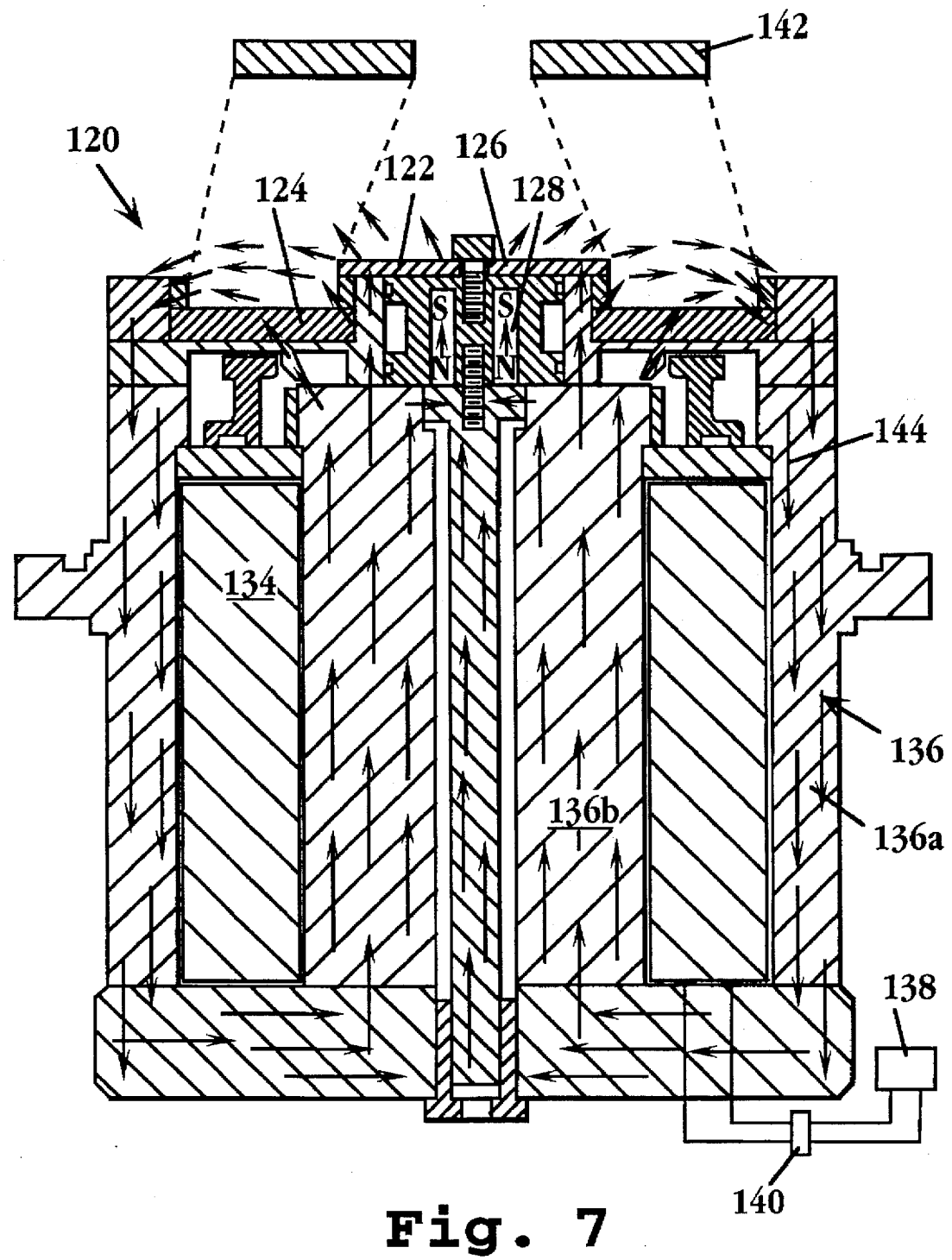
FIG. 7 shows the distribution of magnetic field lines in the target assembly shown in FIG. 5, when the magnetic means are arranged for ignition of the outer target.

FIG. 7 shows the target assembly of FIG. 6, with the outer magnetic means in forward polarity, that is, the outer magnetic means are opposite in polarity from that described with respect to FIG. 6.

Inner magnetic means 128 is oriented as described above, with the magnetic poles in a substantially axial direction with respect to the central axis of the target assembly. Outer magnetic means 134 is controlled by coil source control 138 through relay 140. Relay 140 is in the off position, and a high coil current of between 1.0 and 5.0 amp, more preferably between 1.0 and 3.0 amp, is applied to the electromagnet. A magnetic field is created, as indicated by the arrows in flux path 144. Flux path 144 is defined by magnetic flux in a first direction in inner pole piece 136b, across the outer target, and in an opposite direction along outer pole piece 136a.

The magnetic flux generated is sufficient to ignite a sputtering plasma only in the outer target, when power is supplied at a preselected level to the outer target, for deposition of material onto substrate 142. The direction of flux path 144 and its strength prevent formation of a closed magnetic loop about the inner target, such that a sputtering plasma about the inner target does not ignite.

Table 1 shows magnetic flux measurements, in Gauss, taken for the inner and outer targets of the target assembly with the magnetic means in reverse polarity and in forward polarity, as described in FIGS. 6 and 7, respectively. The magnetic flux created by the magnetic means was measured using a Gaussmeter, with the probe parallel to the target surface (inplane), and with the probe perpendicular to the target surface (out-of-plane).

Magnetic flux was measured with the outer magnetic means in reverse polarity at 0.7 amp and at 1.0 amp. In reverse polarity and at 0.7 amp, the in-plane magnetic flux above the outer target surface was 75 Gauss at the inner diameter pole and 22 Gauss ¼" from the inner diameter pole. The out-of-plane magnetic flux above the inner target surface was +865 Gauss at the inner diameter and −182 Gauss at the outer diameter. The positive and negative values indicate that a closed magnetic loop is present above the surface of the inner target, effective to produce a sputtering plasma in the inner target when power is applied to the target.

In forward polarity and at 0.7 amp, the magnetic flux above the plane of the outer target was 253 Gauss at the inner diameter pole and 100 Gauss ¼" from the inner diameter pole. The magnetic flux above the inner target, measured out-of-plane with respect to the surface of the target, was +1003 Gauss at the inner diameter and +156 Gauss at the outer diameter. The positive values at both inner and outer diameters indicate that there is not a closed magnetic loop above the surface of the inner target when the outer magnetic means is in forward polarity, and the inner target is not ignited when power is applied to the inner target. However, the magnetic field strength above the outer target is sufficient to ignite the outer target when power is supplied to the target.

Similar observations were seen with a coil current of 1.0 amp.

TABLE 1

| Coil Current and Direction | In-Plane, Outer Target, Magnetic Flux (Gauss) | | Inner Target, Magnetic Flux (Gauss) | | |
|---|---|---|---|---|---|
| | I.D. Pole | ¼" from I.D. Pole | Out-of-Plane | | Plane |
| | | | I.D. | O.D. | |
| 0.7 amp, reverse | 75 | 22 | +865 | −182 | 438 |
| 0.7 amp, forward | 253 | 100 | +1003 | +156 | |
| 1.0 amp, reverse | 102 | 40 | +855 | −202 | 465 |
| 1.0 amp, forward | 340 | 125 | +1028 | +206 | |

II. Operation of the Sputtering Assembly

Figure 8:
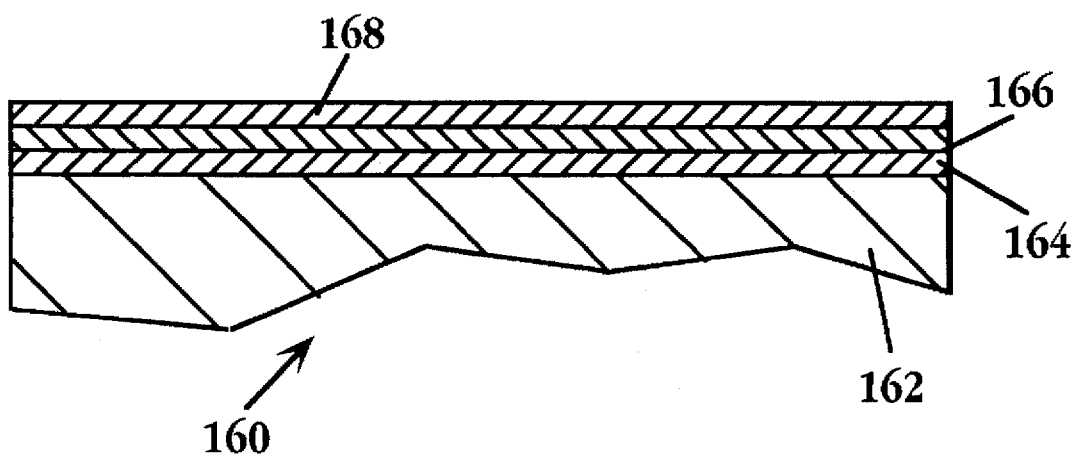
FIG. 8 is a cross-sectional view of a magnetic recording medium formed using the target assembly.

Operation of the above-described sputtering assembly will be described with respect to preparation of a thin-film magnetic recording medium, such as that shown in FIG. 8. Seen in FIG. 8 is a fragmentary portion of a thin-film medium 160 composed of a rigid disk-like substrate 162, and forming successive thin-film layers over the substrate, an underlayer 164, a magnetic thin-film layer 166, and an overcoat 168.

Substrate 162 may be textured or untextured, and in a preferred embodiment is a textured substrate, such as a conventional surface-coated, textured aluminum substrate of the type commonly used for a digital recording medium. Typically, the substrate is first plated with a selected alloy plating, such as a nickel/phosphorus plating, to achieve a requisite surface hardness, with the thickness of the plating being about 300–700 micro-inches. Alternatively, the substrate may be a textured glass or ceramic substrate.

Underlayer 164 is preferably crystalline and formed of chromium or of a chromium-based alloy containing at least 50% chromium, such Cr-Si, Cr-V, Cr-Gd, or Cr-Ti. The underlayer is sputtered to a thickness between about 100–3,000 Å.

Magnetic film layer 166 is preferably composed of a cobalt-based alloy and is deposited to a thickness of between 100–800 Å. By cobalt-based alloy is meant an alloy containing at least 50% cobalt. Exemplary binary alloys include Co/Cr or Co/Ni, and exemplary ternary, quaternary, and five-element alloys include Co/Cr/Ta, Co/Ni/Pt, Co/Ni/Cr, Co/Cr/Ta/Pt, Co/Ni/Cr/Pt, and Co/Cr/Ni/Pt/B. A preferred cobalt-based alloy is composed of 80–90% cobalt, 5–20% chromium and 2–10% tantalum.

Overcoat 168 may be composed of carbon, silicon oxide, silicon nitride, or other suitable material giving wear-resistant, protective properties to the medium.

Medium 160 is formed using the sputtering assembly described above, by loading the substrate into a sputtering apparatus, such as that shown in FIG. 1. The substrate is placed in the sputtering region defined by confronting targets, which are in a preferred embodiment, concentric inner and outer targets.

The substrate is heated by moving the heater included in the sputtering apparatus into its heating position—that is, where the heater faces are disposed on opposite sides of the substrate for radiantly heating both sides of the substrate. The heater is energized and the substrate is heated until the desired substrate temperature is reached, typically between about 200° to 400° C. The heater is powered off and moved to its sputtering position, as shown in FIG. 3B.

After heating, the sputtering chamber housing the sputtering assembly is evacuated, and an inert sputtering gas, such as argon, is introduced into the chamber to a final pressure of between about 2–20 mTorr.

Sputter deposition from either the inner target or the outer target of the target assembly is achieved by igniting the desired target. Ignition of either the inner target or the outer target, when power is applied to one of the targets, depends on the orientation of the magnetic means, as described above.

With respect to the medium shown in FIG. 8 and where the target assembly includes an inner chromium target and an outer target of CoCrTa (84.5/12.5/3.0), the inner target is activated first to deposit chromium underlayer 164 on substrate 162. Ignition of a sputtering plasma in the inner target is achieved, in the presence of a DC potential across the target, by orienting the polarity of the magnetic means to produce a magnetic flux sufficient to ignite the inner target, as described above in FIG. 6.

After deposition of the chromium underlayer to the desired thickness, magnetic recording layer 166 is deposited from the outer CoCrTa target. Ignition of the outer, magnetic target is accomplished by orienting the polarity of one of the magnetic means to be opposite from the orientation for ignition of the inner target, that is, the polarity is reversed, as described above with respect to FIG. 7.

Importantly, the sputtering apparatus of the present invention provides a way to easily maintain the desired substrate temperature since the substrate does not need to be shuttled downstream to an adjacent sputtering chamber for deposition of each layer. The sputter apparatus also provides a way to easily heat the substrate, if desired, between deposition of each layer.

It will be appreciated that a recording medium having multiple magnetic thin-film layers separated by isolation layers can be formed using the sputtering assembly described. The chromium underlayer and a first magnetic thin-film layer are deposited as described above. The substrate remains in the sputtering chamber, and the inner chromium target is ignited again, as described above, for deposition of a chromium interlayer over the first magnetic thin-film layer. The chromium interlayer is deposited to a thickness of between 5–50 Å. A second magnetic thin film layer is then deposited by igniting the outer magnetic target. Ignition of the inner and outer targets can be repeated as many times as desired to form a multilayer magnetic recording medium.

Importantly, when forming such multilayer media, the sputtering apparatus of the present invention provides a means of easily heating the coated substrate between deposition of the sputtered layers. This is especially useful when forming media having multiple magnetic layers separated by isolation layers, as the layers sputtered last, e.g., the outer layers closer to the protective overcoat, are deposited at a substrate temperature near the desired, initial substrate temperature at which the inner layers, e.g., adjacent the substrate, are deposited. As discussed above, maintaining a high substrate temperature results in improved media coercivity and lower media noise. Further, the sputtering apparatus of the present invention eliminates the need to shuttle the substrate between heating and multiple sputtering chambers, reducing the risk of disc damage and contamination.

It will also be appreciated that the inner and outer targets of the target assembly can be of compositions other than chromium and a cobalt-based alloy, for deposition of other layers in the medium. For example, the outer target may be composed of a magnetic alloy and the inner target composed of graphite, for deposition of a magnetic recording layer and a protective carbon overcoat. It is also possible to place a mask or shield over the outer target, to sputter an overcoat having a gradient in thickness.

Although the invention has been described with respect to particular embodiments, it will be apparent to those skilled in the art that various changes and modifications can be made without departing from the invention.

It is claimed:

1. A sputtering assembly for use in sequentially heating and sputtering a substrate, comprising:

a pair of confronting targets defining a sputtering region therebetween, means for holding a substrate in the sputtering region between said targets for deposition when said targets are activated, a heater having a pair of opposed heating faces, said heater being moveable between a heating position, where said heater faces are disposed in said sputtering region on opposite sides of the substrate for radiantly heating opposed sides of the substrate, and a sputtering position where said heater faces are outside of said sputtering region.

2. The assembly of claim 1, wherein each target in said target pair includes inner and outer concentric targets for sputter deposition of two different materials on said substrate.

3. The assembly of claim 2, which further includes inner magnetic means disposed adjacent an inner annular portion of said inner targets, and having a substantially axial magnetic pole orientation, outer magnetic means disposed adjacent the outer targets and an outer annular region of each of the inner targets, and having a substantially radial magnetic pole orientation, at least one of said magnetic means being reversible in magnetic-pole polarity, wherein one polarity produces a magnetic flux sufficient to ignite a sputtering plasma in the inner targets only, when power is supplied to the inner targets at a preselected level, and the opposite polarity produces a magnetic flux sufficient to ignite a sputtering plasma in the outer targets only, when power is supplied to the outer targets at a preselected level.

4. The assembly of claim 1, wherein said heater is an infrared lamp.

5. A method of depositing by sputter deposition a layer on a substrate, comprising:

placing said substrate in a sputtering chamber including (i) a pair of confronting targets defining a sputtering region there between and (ii) a heater having a pair of opposed heating faces, said heater being moveable between a heating position, where said heater faces are disposed in said sputtering region on opposite sides of the substrate for radiantly heating opposed sides of the substrate, and a sputtering position where said heater faces are outside of said sputtering region;

positioning said heater in said heating position for heating said substrate to a selected sputtering temperature;

moving said heating means to said sputtering position; and energizing said targets to achieve ignition of a sputtering plasma in said sputtering region.

6. The method of claim 5, wherein said placing further includes placing said substrate between a pair of confronting targets composed of inner and outer concentric targets, each target having inner and outer magnetic means disposed adjacent said inner and outer targets, respectively, where at least one of said magnetic means is reversible in magnetic-pole polarity, and one polarity produces a magnetic flux sufficient to ignite a sputtering plasma in the inner target only, and the opposite polarity produces a magnetic flux sufficient to ignite a sputtering plasma in the outer target only;

orienting the polarity of one of said magnetic means to achieve ignition of a sputtering plasma in the inner target, when power is supplied to the inner target at a preselected level;

sputtering from said inner target, a layer onto said substrate;

reversing the polarity of said one magnetic means to achieve ignition of a sputtering plasma in the outer target, when power is supplied to the outer target at a preselected level; and sputtering from said outer target, a layer directly on the layer sputtered from said inner target.

* * * * *